United States Patent
Yoneyama

(10) Patent No.: US 9,721,524 B2
(45) Date of Patent: Aug. 1, 2017

(54) POWER SUPPLY CIRCUIT, DISPLAY PANEL DRIVER AND DISPLAY DEVICE INCORPORATING THE SAME

(71) Applicant: Synaptics Japan GK, Tokyo (JP)

(72) Inventor: Teru Yoneyama, Tokyo (JP)

(73) Assignee: Synaptics Japan GK, Tokyo (JP)

( * ) Notice: Subject to any disclaimer, the term of this patent is extended or adjusted under 35 U.S.C. 154(b) by 136 days.

(21) Appl. No.: 14/672,687

(22) Filed: Mar. 30, 2015

(65) Prior Publication Data
US 2015/0279304 A1  Oct. 1, 2015

(30) Foreign Application Priority Data

Mar. 31, 2014  (JP) ................................ 2014-074012

(51) Int. Cl.
| | |
|---|---|
| *G05F 1/00* | (2006.01) |
| *G09G 3/36* | (2006.01) |
| *G06T 1/60* | (2006.01) |
| *H03K 3/012* | (2006.01) |

(52) U.S. Cl.
CPC ............ *G09G 3/3696* (2013.01); *G06T 1/60* (2013.01); *H03K 3/012* (2013.01)

(58) Field of Classification Search
CPC .... H02M 3/156; H02M 3/158; H02M 3/1588; H02M 2003/1566; H02M 3/155; H02M 3/1582; H01F 38/14; H02J 1/00
USPC ........... 323/273–285, 293, 363, 365; 307/43, 307/107
See application file for complete search history.

(56) References Cited

U.S. PATENT DOCUMENTS

| | | | | |
|---|---|---|---|---|
| 2009/0322731 | A1* | 12/2009 | Yasuda | ................ G09G 3/3659 345/213 |
| 2014/0085284 | A1* | 3/2014 | Sun | ...................... G09G 3/3233 345/211 |
| 2015/0194886 | A1* | 7/2015 | Zanetta | ................ H02M 3/158 327/309 |

FOREIGN PATENT DOCUMENTS

JP       2010256968 A    11/2010

* cited by examiner

*Primary Examiner* — Adolf Berhane
*Assistant Examiner* — Afework Demisse
(74) *Attorney, Agent, or Firm* — Patterson + Sheridan, LLP

(57) ABSTRACT

A semiconductor integrated circuit includes a power line and a power supply circuitry. The power supply circuitry includes: a first power supply circuit operating on a first power supply voltage and having an output connected with the power line; and a second power supply circuit operating on a second power supply voltage higher than the first power supply voltage and having an output connected with the power line. The first power supply circuit is configured to drive the power line to a first preset, voltage. The second power supply circuit is configured to drive the power line to a second preset voltage lower than the first preset voltage. The second power supply circuit is configured not to decrease a third power supply voltage generated on the power line when the third power supply voltage is higher than the second preset voltage.

9 Claims, 7 Drawing Sheets

POWER SUPPLY CIRCUIT, DISPLAY PANEL DRIVER AND DISPLAY DEVICE INCORPORATING THE SAME

CROSS REFERENCE

This application claims priority of Japanese Patent Application No. 2014-074012, filed on Mar. 31, 2014, the disclosure which is incorporated herein by reference.

TECHNICAL FIELD

The present invention relates to a power supply circuit, a display panel driver and a display device.

BACKGROUND ART

The progress in the multifunctionality of recent, semiconductor integrated circuits causes an increase in the circuit scale. For example, recent progresses in the resolution and multifunctionality of liquid crystal display devices used in portable terminals such as smart phones and cellular phones have brought about an increase in the scale of RAMs (random access memories) and logic circuits integrated in driver ICs (integrated circuits) which drive liquid crystal display panels.

The increase in the multifunctionality and scale is inevitably accompanied by an increase in the number of external connection terminals. The increase in the number of external connection terminals restricts the size of the external connection terminals, causing a difficulty in the device mounting. The difficulty in the device mounting undesirably increases the variations in the contact resistances of external terminals and this may increase contact resistances at external connection terminals of semiconductor integrated circuits.

This problem is especially significant for semiconductor integrated circuits using a flipchip connection, for example, driver ICs connected with display panels. The reduction in the size of external connection terminals of a driver IC undesirably causes the difficulty in assembling the driver IC onto a display panel with a flip chip connection in a display device (or a display module) and undesirably increases the variance in the contact resistances between interconnections on the display panel and external connection terminals of the driver IC. This implies that some of display devices inevitably suffer from a high contact resistance.

One problem caused by the increase in the contact resistance at external connection terminals is reduction in the drive capacity of a power supply circuit which feeds a power supply voltage to internal circuits. The increase in the contact resistance at an external power supply terminal through which an external power supply voltage is fed to the power supply circuit undesirably decreases the voltage actually fed to the power supply circuit due to the voltage drop across the external power supply terminal, causing degradation of the drive capacity of the power supply circuit. A recent semiconductor integrated circuit with high multifunctionality and integration consumes a large amount of power, and therefore the degradation of the drive capacity of the power supply circuit may cause a malfunction of the semiconductor integrated circuit. The problem of the degradation of the drive capacity of the power supply circuit may be caused by a different reason other than the increase in the contact resistance at an external connection terminal, for example, a decrease in the external power supply voltage itself.

It should be noted that Japanese Patent Application Publication No. 2010-256968 A discloses a power supply regulator circuit which generates a desired voltage from a power supply voltage fed from a battery.

SUMMARY

Embodiments of the disclosure generally include a semiconductor integrated circuit, a display device and a method for method for operating a display driver. In one embodiment, a semiconductor integrated circuit is provided that includes a power line and a power supply circuitry. The power supply circuitry includes a first power supply circuit, a second power supply circuit. The first power supply circuit is configured to operate on a first power supply voltage and having an output connected with the power line. The second power supply circuit is configured to operate on a second power supply voltage that is higher than the first power supply voltage. The second power supply circuit has an output connected with the power line. The first power supply circuit is configured to drive the power line to a first preset voltage, wherein the second power supply circuit is configured to drive the power line to a second preset voltage lower than the first preset voltage. The second power supply circuit is configured not to decrease a third power supply voltage generated on the power line when the third power supply voltage is higher than the second preset voltage.

In another embodiment, a display device is provided. The display device includes a display panel and a display panel driver configured to drive the display panel. The display panel driver includes a power line and a power supply circuitry. The power supply circuitry includes a first power supply circuit and a second power supply circuit. The first power supply circuit is configured to operate on a first power supply voltage and has an output connected with the power line. The second power supply circuit is configured to operate on a second power supply voltage that is higher than the first power supply voltage. The second power supply circuit has an output connected with the power line. The first power supply circuit is configured to drive the power line to a first preset voltage. The second power supply circuit is configured to drive the power line to a second preset voltage lower than the first preset voltage. The second, power supply circuit is configured not to decrease a third power supply voltage generated on the power line when the third power supply voltage is higher than the second preset voltage.

In another embodiment, a method for operating a display driver is provided that includes providing a first power supply voltage to a first power supply circuit having an output connected with a power line; providing a second power supply voltage to a second power supply circuit having an output connected with the power line, the second power supply voltage being higher than the first power supply voltage; driving, using the first power supply circuit, the power line to a first preset voltage; and driving, using the second power supply circuit, the power line to a second preset voltage, the second preset voltage being lower than the first preset voltage, wherein the second power supply circuit is configured not to decrease a third power supply voltage generated on the power line when the third power supply voltage is higher than the second preset, voltage.

DETAILED DESCRIPTION

Introduction

Techniques are provided herein for suppressing degradation of the drive capacity of a power supply circuit. Other objectives, problems and new features of the present disclosure will be understood from the following disclosures.

In one embodiment, a semiconductor integrated circuit includes a power line and a power supply circuitry. The power supply circuitry includes: a first power supply circuit operating on a first power supply voltage and having an output connected with the power line; and a second power supply circuit operating on a second, power supply voltage higher than the first power supply voltage and having an output connected with the power line. The first power supply circuit is configured to drive the power line to a first preset voltage and the second power supply circuit is configured to drive the power line to a second preset voltage lower than the first preset voltage. The second power supply circuit is configured not to decrease a third power supply voltage generated on the power line when the third power supply voltage is higher than the second preset voltage.

In one embodiment, such a semiconductor integrated circuit may be integrated in a display panel driver that drives a display panel in a display device.

Embodiments of the present disclosure effectively suppresses degradation of the drive capacity of a power supply circuit.

The disclosure will be now described herein with reference to illustrative embodiments. Those skilled, in the art would recognize that many alternative embodiments can foe accomplished using the teachings of the present disclosure and that the disclosure is not limited to the embodiments illustrated for explanatory purposed.

First Embodiment

In a first embodiment, a power supply circuit according to the present disclosure is implemented as a logic power supply circuitry integrated, in a driver IC of a liquid crystal display device. In the following, a detailed description is given of exemplary configurations of a liquid crystal display device and a driver IC incorporated therein in the first embodiment.

Figure 1:
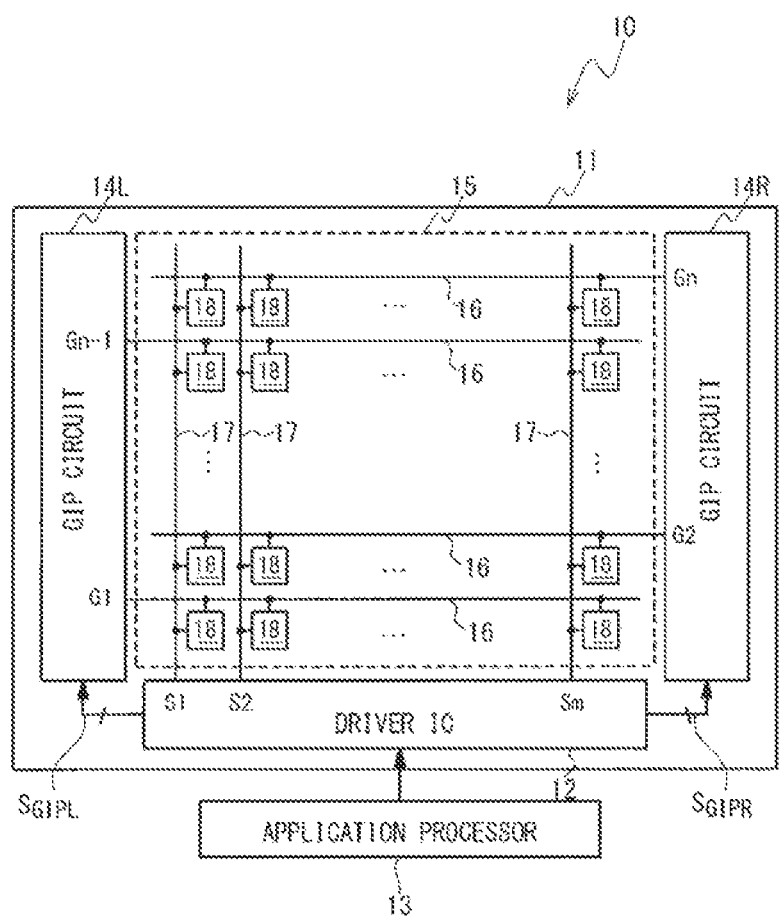
FIG. 1 is a block diagram illustrating an example of the configuration of a liquid crystal display device in a first embodiment of the present invention.

FIG. 1 is a block diagram illustrating an example of the configuration of a liquid crystal display device 10 in the first embodiment of the present disclosure. The liquid crystal display device 10 includes a liquid crystal display panel 11 and a driver IC 12. The driver IC 12 is flipchip-connected with the liquid crystal display panel 11 with a surface mounting technique such as a COG (chip on glass technique.

The liquid crystal display panel 11 includes a pair of GIP (gate-in-panel) circuits 14L, 14R and a display region 15. The GIP circuit 14L is disposed on the left of the display region 15 and the GIP circuit 14R is disposed on the right of the display region 15. Disposed in the display region 15A are a plurality of gate lines (also referred to as scanning lines or address lines) 16, a plurality of source lines 17 (also referred to as signal lines or data lines) and a plurality of subpixels 18 arrayed in rows and columns in the display region 15. Each subpixel 18 is configured to display one of the red color (R), the green color (G) and the blue color (B) and each pixel of the liquid crystal display panel 11 includes three subpixels 18 that display the red color (R), green color (G) and blue color (B), respectively. The GIP circuit 14L drives odd-numbered gate lines 16 and the GIP circuit 14R drives even-numbered gate lines 16.

The driver IC 12 is a display panel driver that performs various operations to drive the liquid crystal display panel 11. The driver IC 12 operates as follows. First, the driver IC 12 drives the source lines 17 in response to image data and control data received from an application processor 13. The image data are data corresponding to images to be displayed in the display region 15 of the liquid crystal display panel 11; the image data specifies the grayscale levels of the respective subpixels 18. The driver IC 12 further generates gate control signals $S_{GIPL}$ that control the GIP circuit 14L and gate control signals $S_{GIPR}$ that control the GIP circuit 14R, in response to the control data received from the application processor 13.

Figure 2:
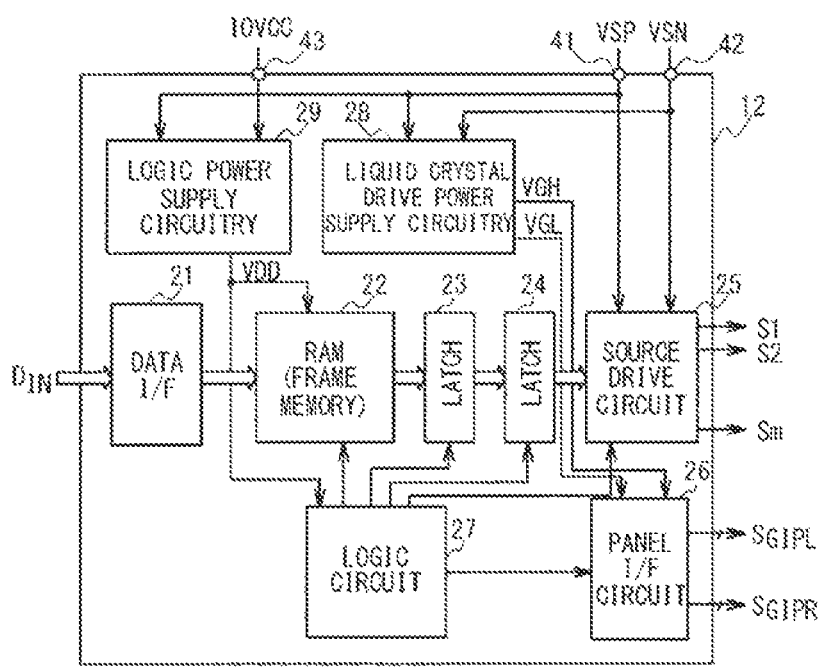
FIG. 2 is a block diagram schematically illustrating one example of the configuration of a driver IC in the first embodiment.

FIG. 2 is a block diagram schematically illustrating one example of the configuration of the driver IC 12 in the present embodiment. In the present embodiment, the driver IC 12 includes a data interface 21, a RAM (random access memory) 22, latches 23, 24, a source drive circuit 25, a panel interface circuit 26 and a logic circuit 27. It should be noted that FIG. 3 only partially illustrates the configuration of the driver IC 12 and various other circuits may be integrated in the driver IC 12 in an actual implementation.

The data interface 21 externally receives image data $D_{IN}$ (from the application processor 13 in the present embodiment). The RAM 22 is used as a frame memory that temporarily stores the image data $D_{IN}$. The latch 23 stores the image data $D_{IN}$ sequentially read out from the RAM 22 and the latch 24 latches the image data $D_{IN}$ stored in the latch 23 in response to the start of each horizontal synchronisation period and stores therein the latched image data. The source drive circuit 25 generates source drive signals S1 to Sm that drive the respective source lines 17 in response to the image data $D_{IN}$ stored in the latch 24. The panel interface circuit 26 generates the gate control signals $S_{GIPL}$ that control the GIP circuit 14L and the gate control signals $S_{GIPR}$ that control the GIP circuit 14R.

Various power supply voltages with various voltage levels are used in respective circuits in the driver IC 12. For example, the RAM 22 and the logic circuit 27 operate on a logic power supply voltage VDD, which is relatively low.

Also, the driver IC 12 includes external power supply terminals 41 and 42 which externally receive power supply voltages VSP and VSN, respectively, and the source drive circuit 25 operates on the power supply voltages VSP and VSN fed to the external power supply terminals 42 and 42, where the power supply voltage VSP is a positive power supply voltage with a relatively high voltage level, and the power supply voltage VSN is a negative power supply voltage. The power supply voltage VSP is higher than the logic power supply voltage VDD. The external power supply terminals 41 and 42 are external connection terminals externally receiving the power supply voltages VSP and VSN. In the present embodiment in which the driver IC 12 is flipchip-connected with the liquid crystal display panel 11, the external power supply terminals 41 and 42 each include a pad connected with a power line in the driver IC 12 and a bump formed in contact with the pad.

The panel interface circuit 26 operates on a high-side gate voltage VGH and a low-side gate voltage VGL. The high-side gate voltage VGH is a voltage corresponding to the "high" level of the gate lines 16 and further higher than the power supply voltage VSP. The low-side gate voltage VGL is a predetermined negative voltage corresponding to the "low" level of the gate lines 16. In order to supply respective circuits in the driver IC 12 with power supply voltages with various voltage levels, the driver IC 12 includes power supply circuitries. In the present embodiment, the driver IC 12 includes a liquid crystal drive power supply circuitry 26 and a logic power supply circuitry 29.

The liquid crystal drive power supply circuitry 28 generates the high-side gate voltage VGH and the low-side gate voltage VGL by using the power supply voltages VSP and VSN externally fed to the external power supply terminals 41 and 42.

The logic power supply circuitry 29 generates the logic power supply voltage VDD from a power supply voltage IOVCC externally fed to an external power supply terminal 43. The power supply voltage IOVCC has a relatively low voltage level, for example, of 1.8V. The external power supply terminal 43 is an external connection terminal that externally receives the power supply voltage IOVCC. In the present embodiment in which the driver IC 12 is flipchip-connected with the liquid crystal display panel 11, the external power supply terminal 43 includes a pad connected with a power line in the driver IC 12 and a bump formed in contact with the pad. Recent semiconductor integrated circuits are designed to operate logic circuits with low power supply voltages due to the progress in the integration degree and the strong requirement of low power consumption. In the driver IC 12 of the present embodiment the RAM 22 and the logic circuit 27 are designed to operate on the logic power supply voltage VDD, which is relatively low. In this regard, the power supply voltage IOVCC, which is externally fed to generate the logic power supply voltage VDD, also has a relatively low voltage level.

In the present embodiment in which the driver IC 12 is flipchip-connected with the liquid crystal display panel 11, the supply of the power supply voltages VSP, VSN and IOVCC to the external power supply terminals 41, 42 and 43 are achieved by connecting the external power supply terminals 41, 42 and 43 of the driver IC 12 with interconnections disposed on the liquid crystal display panel 11 to receive the power supply voltages VSP, VSN and IOVCC, respectively.

One problem of this structure is that the contact resistances at the external power supply terminals 41, 42 and 43 may be undesirably increased. The enhanced integration and multi-functionality of the driver IC 12 as described above may be accompanied by reduction of the size of external connection terminals of the driver IC 12 and this may increase variations in the contact resistances between the interconnections formed on the liquid crystal display panel 11 and the external power supply terminals 41, 42 and 43 of the driver IC 12 due to the difficulty in the IC chip mounting. This implies that the liquid crystal display device 10 may suffer from high contact resistances at the external power supply terminals 41, 42 and 43.

An increase in the contact resistance at the external power supply terminal 43 is also undesirable, since this may cause degradation of the drive capacity of the logic power supply circuitry 29.

Since the power supply voltage IOVCC has a relatively low voltage level, an increase in the voltage drop across the external power supply terminal 43 caused by an increase in the contact resistance at the external power supply terminal 43 may cause an unacceptable degradation in the drive capacity of the logic power supply circuitry 29, which operates on the power supply voltage IOVCC.

In order to address this problem, the logic power supply circuitry 23 of the present embodiment is adapted to generate the logic power supply voltage VDD by using not only the power supply voltage IOVCC (a first power supply voltage) but also the power supply voltage VSP (a second power supply voltage), which is higher than the power supply voltage IOVCC. It should be noted here that the generation of the logic power supply voltage VDD by using the high power supply voltage VSP undesirably increases the power consumption. In view of this, the logic power supply circuitry 29 of the present embodiment is configured to generate the logic power supply voltage VDD by using the high power supply voltage VSP only when the use of the power supply voltage VSP is necessary for maintaining the logic power supply voltage VDD above a predetermined voltage. In the following, a detailed description is given of an exemplary configuration of the logic power supply circuitry 29 in the present embodiment.

Figure 3:
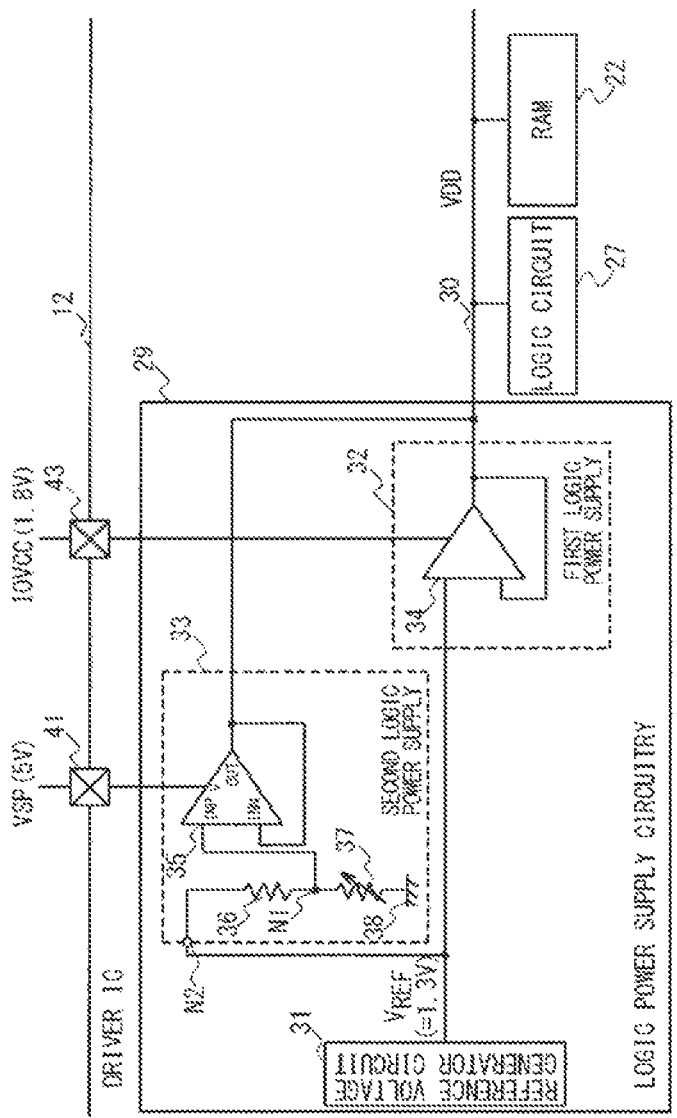
FIG. 3 is a circuit diagram illustrating one example of the configuration of a logic power supply circuitry in the first embodiment.

FIG. 3 is a circuit diagram illustrating one example of the configuration of the logic power supply circuitry 29. The logic power supply circuitry 29 includes a reference voltage generator circuit 31, a first logic power supply circuit 32 and a second logic power supply circuit 33.

The reference voltage generator circuit 31 generates a reference voltage $V_{REF}$. In one example, the reference voltage generator circuit 31 generates the reference voltage $V_{REF}$ with a voltage level of 1.3V. The generated reference voltage $V_{REF}$ is fed to the first logic power supply circuit 32 and the second logic power supply circuit 33.

The first logic power supply circuit 32 operates on the power supply voltage IOVCC received from the external power supply terminal 43 to drive the power line 30. It should be noted that the power line 30 is used to feed the logic power supply voltage VDD to various circuits of the driver IC 12, including the RAM 22 and the logic circuit 27. In the present embodiment, the first logic power supply circuit 32 includes an operational amplifier 34 that is configured as a voltage follower. The operational amplifier 34 has a first input receiving the reference voltage $V_{REF}$ and a second input connected with the output of the operational amplifier 34. The output of the operational amplifier 34 is connected with the power line 30. The operational amplifier 34 drives the power line 30 so that the logic power supply voltage VDD generated on the power line 30 is controlled to a first preset voltage $V_I$ which is determined as equal to the reference voltage $V_{REF}$ (as long as it is possible to do so). The operational amplifier 34 operates on the power supply voltage IOVCC.

The second logic power supply circuit 33 operates on the power supply voltage VSP received from the external power supply terminal 41 to drive the power line 30. In the present embodiment, the second logic power supply circuit 33 drives the power line 30 so that the logic power supply voltage VDD generated on the power line 30 is controlled to a second preset voltage $V_2$ which is lower than the first preset voltage $V_1$ (that is, the reference voltage $V_{REF}$). It should be noted however that the second logic power supply circuit 33 does not operate to decrease the logic power supply voltage VDD when the logic power supply voltage VDD is higher than the second preset voltage $V_2$. In other words, the second logic power supply circuit 33 is configured not to pull down the power line 30 even when the logic power supply voltage VDD is higher than the second preset voltage $V_2$.

More specifically, the second logic power supply circuit 33 includes an operational amplifier 35, a register element 36 and a variable resister element 37. The operational amplifier 35 has an output connected, with the power line 30, a non-inverting input INP connected with a node N1 and an inverting input INN connected with the output of the operational amplifier 35, and operates as a voltage follower. The operational amplifier 35 drives the power line 30 in response to the potential difference between the non-inverting input INP and the inverting input INN. The operational amplifier 35 operates on the power supply voltage VSP. The register element 36 is connected between the node N1 and a node N2 and the variable resister element 37 is connected between the node N1 and a ground terminal 38, where the node N2 is a node of the second logic power supply circuit 33, to which the reference voltage $V_{REF}$ is fed from the reference voltage generator circuit 31. The resistance of the variable resister element 37 is adjusted so that the voltage outputted from the operational amplifier 35 is controlled to the second preset voltage $V_2$, which is lower than the first preset voltage $V_1$ (that is, the reference voltage $V_{REF}$). In detail, the resistance of the variable resister element 37 is set so that the voltage generated on the node N1 is controlled to the second, preset voltage $V_2$ through voltage dividing of the reference voltage $V_{REF}$ with the resister element 36 and the variable resistor element 37.

Figure 4:
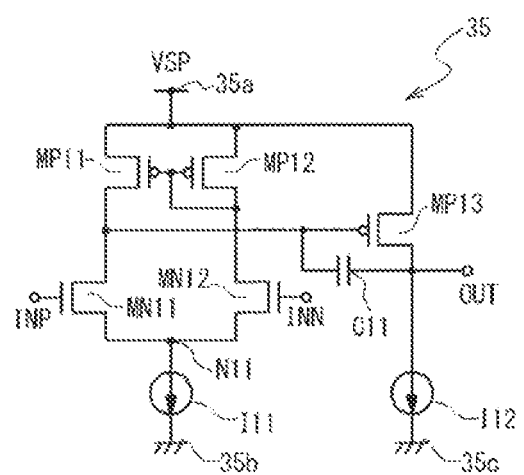
FIG. 4 is a circuit diagram illustrating one example of the configuration of an operational amplifier in the first embodiment.

FIG. 4 is a circuit diagram illustrating one example of the configuration of the operational amplifier 35. In the present embodiment, the operational amplifier 35 includes NMOS transistors MN11, MN12, PMOS transistors MP11 to MP13, constant current sources I11, I12 and a capacitor C11.

The NMOS transistors MN11 and MN12 form a differential transistor pair and the sources of the NMOS transistors MN11 and MN12 are commonly connected with a node N11. The gate of the NMOS transistor MN11 is connected with the non-inverting input INP of the operational amplifier 35 and the gate of the NMOS transistor MN12 is connected with the inverting input INN of the operational amplifier 35.

The constant current source I11 is connected between the node N11 and a ground terminal 35b to draw a constant current from the node N11.

The PMOS transistors MP11 and MP12 form a current mirror used as a load of the differential transistor pair. The sources of the PMOS transistors MP11 and MP12 are commonly connected with a power supply terminal 35a to which the power supply voltage VSP is fed, and the drains of the PMOS transistors MP11 and MP12 are connected with the drains of the NMOS transistors MN11 and MN12, respectively. The gates of the PMOS transistors MP11 and MP12 are commonly connected with the drain of the PMOS transistor MP12.

The PMOS transistor MP13 operates as an output transistor that pulls up the output terminal OUT of the operational amplifier 35. The PMOS transistor MP13 has a source connected with the power supply terminal 35a, a drain connected with the output terminal OUT and a gate connected with the drain of the PMOS transistor MP11.

The constant current source I12 is connected between the output terminal OUT of the operational amplifier 35 and a ground terminal 35c to operate as a load of the PMOS transistor MP13.

It should be noted that the configuration of the operational amplifier 35 illustrated in FIG. 4 is designed so that the drive capacity for pulling up the output terminal OUT (that is, for increasing the voltage level on the output terminal OUT) is high, while the drive capacity for pulling down the output terminal OUT (that is, for decreasing the voltage level on the output terminal OUT) is low. The pull-up of the output terminal OUT of the operational amplifier 35 is achieved by the PMOS transistor MP13, which operates in response to the voltage level on the output, terminal OUT (more specifically, the potential difference between the non-inverting input IMP and inverting input INN). On the other hand, the pull-down of the output terminal OUT of the operational amplifier 35 is achieved by the constant current source I12 (that is, the load), which operates independently of the potential difference between the non-inverting input INP and inverting input INN. This configuration is related to the fact that the second logic power supply circuit 33, which includes the operational amplifier 35, is configured not to decrease the logic power supply voltage VDD when the logic power supply voltage VDD is higher than the second preset voltage $V_2$.

Figure 5:
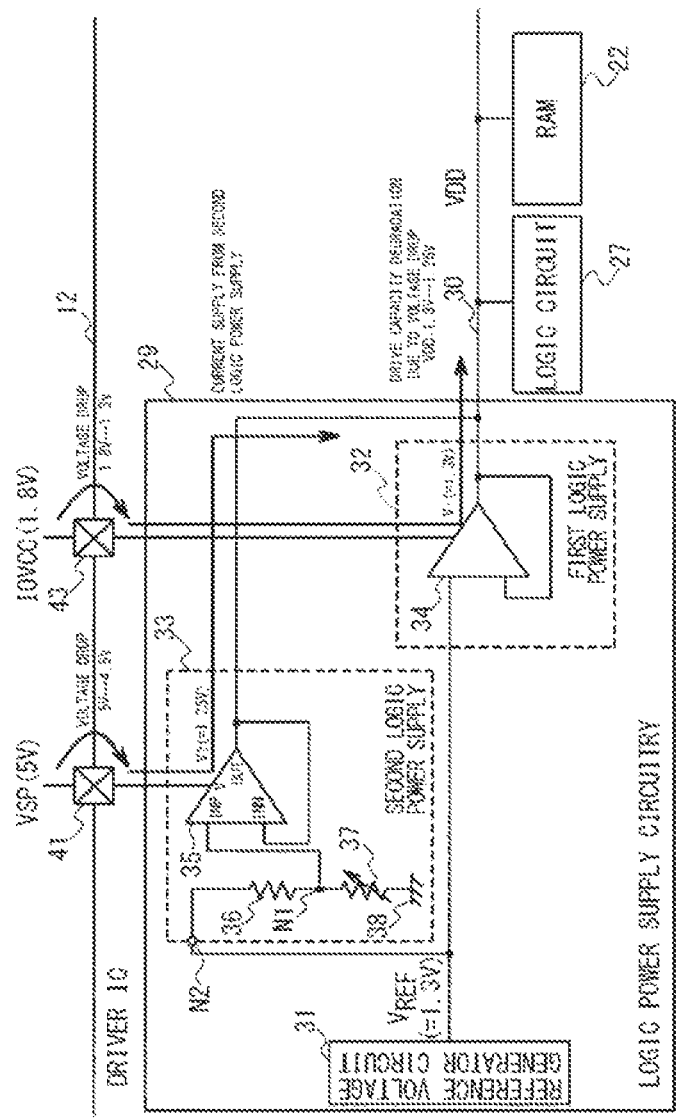
FIG. 5 is a circuit diagram conceptually illustrating the operation of the logic power supply circuitry in the first embodiment.

FIG. 5 is a circuit diagram conceptually illustrating an exemplary operation of the logic power supply circuitry 29 in the present embodiment. Illustrated in FIG. 5 is one example of the operation of the logic power supply circuitry 29 in the case when the power supply voltage IOVCC is 1.8V, the power supply voltage VSP is 5.0V, the reference voltage $V_{REF}$ and the first preset voltage $V_1$ are both 1.3V, and the second preset voltage $V_2$ is 1.25V. In this case, the desired value of the logic power supply voltage VDD is 1.3V, which is equal to the first preset voltage $V_1$ (that is, the reference voltage $V_{REF}$).

When the contact resistance at the external power supply terminal 43, which externally receives the power supply voltage IOVCC, is sufficiently reduced, a voltage almost equal to the power supply voltage IOVCC (1.8V) is fed to the operational amplifier 34 of the first logic power supply circuit 32. In this case, the operational amplifier 34 exhibits a sufficient drive capacity and therefore the operational amplifier 34 successfully drives the power line 30 to the first preset voltage $V_1$ (that is, the reference voltage $V_{REF}$). As a result, the logic power supply voltage VDD generated on the power line 30 is controlled to the first preset voltage $V_1$ (1.3V). This results in that the RAM 22 and the logic circuit 27 receives the logic power supply voltage VDD with a sufficient voltage level for their operations.

In this case, the operational amplifier 35 of the second logic power supply circuit 33 fails to drive the power line 30, since the logic power supply voltage VDD generated, on the power line 30 is higher than the second preset voltage $V_2$ (1.25V). The scheme in which the second logic power supply circuit 33, which operates on the high power supply voltage VSP, fails to drive the power line 30 when the first logic power supply circuit 32 can generate the logic power supply voltage VDD with a desired voltage level by itself is effective for reducing the power consumption.

When the contact resistance at the external power supply terminal 43, which externally receives the power supply voltage IOVCC (1.8V), is undesirably increased, in the mounting of the driver IC 12 onto the liquid crystal display panel 11, the power supply voltage actually fed to the operational amplifier 34 of the first logic power supply circuit 32 is reduced below the power supply voltage IOVCC fed to the external power supply terminal 43. Discussed below is the case when the power supply voltage actually fed to the operational amplifier 34 is reduced down to a voltage of 1.3V.

In this case, the operational amplifier 34 may fail to exhibit a sufficient drive capacity, causing the first logic power supply circuit 32 to be unable to maintain the logic power supply voltage VDD on the power line 30 at a voltage level sufficient to operate the RAM 22 and the logic circuit 27 by itself. In such a case, the second logic power supply circuit 33 starts such an operation that the second logic power supply circuit 33 drives the poser line 30 when the power supply voltage VDD is about to become lower than the second preset voltage $V_2$ (1.25V). This operation effectively controls the power line 30 at the second preset voltage $V_2$ (1.25V) and allows feeding the logic power supply voltage VDD with a voltage level sufficient for performing desired operations to the RAM 22 and the logic circuit 27.

When the contact resistance at the external power supply terminal 43, which, externally receives the power supply voltage IOVCC, is high, the contact resistance at the external power supply terminal 41, which externally receives the power supply voltage VSP, is likely to be also high; however, the operational amplifier 35 exhibits a sufficient drive capacity for driving the power line 30 to the second preset voltage $V_2$ (1.25V) since the voltage level of the power supply voltage VSP is sufficiently high.

As thus described, the logic power supply circuitry 29 is configured to operate the second logic power supply circuit 33, which operates on a relatively high power supply voltage (the power supply voltage VSP in the present embodiment), to maintain the power line 30 at the second preset voltage $V_2$, when the power supply voltage actually fed to the first logic power supply circuit 32 is decreased due to an increased contact resistance at the external power supply terminal 43. When the power supply voltage actually fed to the first logic power supply circuit 32 has a sufficiently high voltage level due to a reduced, contact resistance at the external power supply terminal 43, on the other hand, the first logic power supply circuit 32 drives the power line 30 to the first preset voltage $V_1$ by itself. Such an operation effectively avoids degradation of the drive capacity of the logic power supply circuitry 29, while reducing the power consumption in the normal operation (that is, the operation in which the contact resistance at the external power supply terminal 43 is low).

It should be noted that, although the above-described embodiments recite that the power supply voltage VSP is fed to the second logic power supply circuit 33 of the logic power supply circuitry 29 in addition to the power supply voltage IOVCC, other power supply voltages having a voltage level higher than that of the power supply voltage IOVCC may be fed to the second logic power supply circuit 33 in place of the power supply voltage VSP.

Second Embodiment

Figure 6:
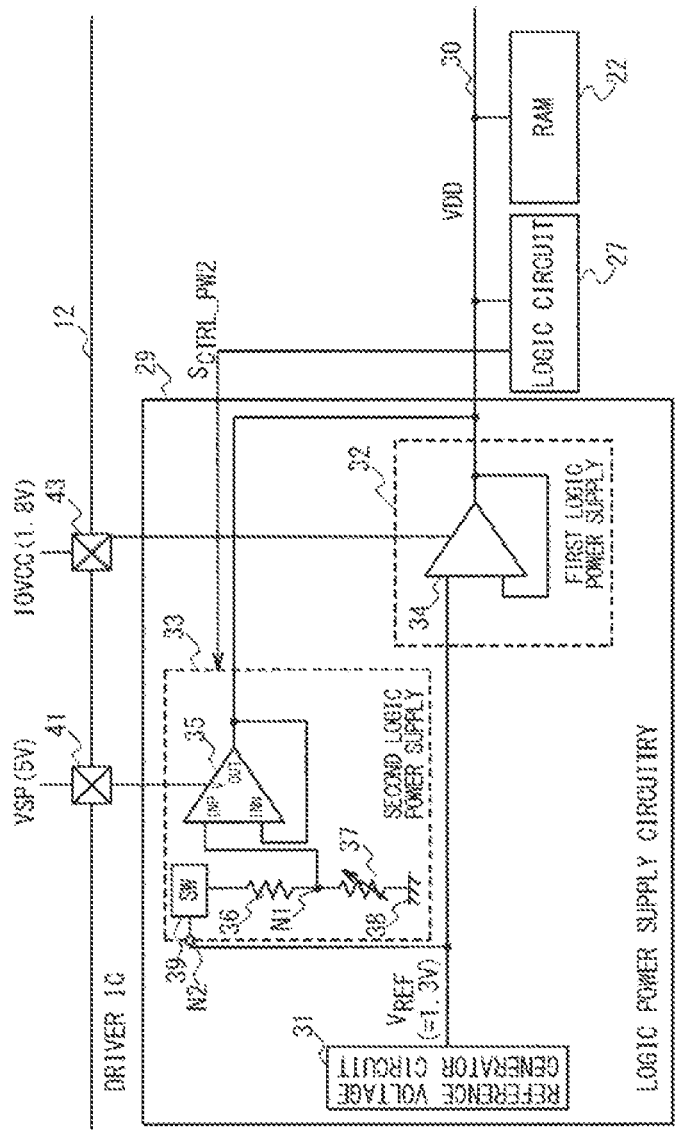
FIG. 6 is a block diagram schematically illustrating one example of the configuration of a driver IC in a second embodiment.

FIG. 6 is a circuit diagram illustrating one example of the configuration of the driver IC 12 of the liquid crystal display device 10 in a second embodiment. The configurations of the driver IC 12 and the liquid, crystal display device 10 in the second embodiment are almost similar to those in the first embodiment (see FIGS. 1 to 3). It should be noted however that, in the second embodiment, the driver IC 12 is configured, so that the logic circuit 27 generates a control signal $S_{CTRL\_PW2}$ used to switch the second logic power supply circuit 33 between the enable state and the disabled state and feeds the control signal $S_{CTRL\_PW2}$ the second logic power supply circuit 33. Additionally, the second logic power supply circuit 33 further includes a switch 39 that operates in response to the control signal $S_{CTRL\_PW2}$.

When the control signal $S_{CTRL\_PW2}$ is asserted, the second logic power supply circuit 33 is enabled and the operation of the second logic power supply circuit 33 is allowed. In this case, the switch 39 is placed into the on-state in response to the assertion of the control signal $S_{CTRL\_PW2}$ and the operational amplifier 35 drives the power line 30 to maintain the power line 30 at the second preset voltage when the logic power supply voltage VDD is about to become lower than the second preset voltage $V_2$.

When, the control signal $S_{CTRL\_PW2}$ is negated, the second logic power supply circuit 33 is disabled and the operation of the second logic power supply circuit 33 is prohibited. In this case, the switch 29 is placed into the off-state in response to the negation of the control signal $S_{CTRL\_PW2}$ and the operational amplifier 35 stops operating regardless of the voltage level of the power supply voltage VDD on the power line 30. When the operational amplifier 35 of the second logic power supply circuit 33 is configured as illustrated in FIG. 4, for example, the operations of the constant current sources I11 and I12 are stopped to halt the operation of the operational amplifier 35.

The present embodiment effectively avoids the degradation in the drive capacity of the logic power supply circuitry 23 with further reduced power consumption through enabling the second logic power supply circuit 33 with the control signal $S_{CTRL\_PW2}$ only during a period during which the power consumption of circuits that receive the logic power supply voltage VDD from the power line 30 is expected to be large. In general, the power consumption in each circuit of the driver IC 12 is estimated in the design of the driver IC 12 and therefore it can be easily predicted that the power consumption of a specific circuit integrated in the driver IC 12 is increased in a specific operation. The problem of the lack of the drive capacity of the logic power supply circuitry 29 mainly occurs when the power consumption of circuits that receive the logic power supply voltage VDD from the power line 30 is large. Accordingly, in the present embodiment, the operation of the second logic power supply circuit 33 is allowed by asserting the control signal $S_{CTRL\_PW2}$ a little time before a specific circuit starts a specific operation which requires increased power consumption. After the specific operation is completed, the control signal $S_{CTRL\_PW2}$ is negated to stop the operation of the second logic power supply circuit 33.

Figure 7:
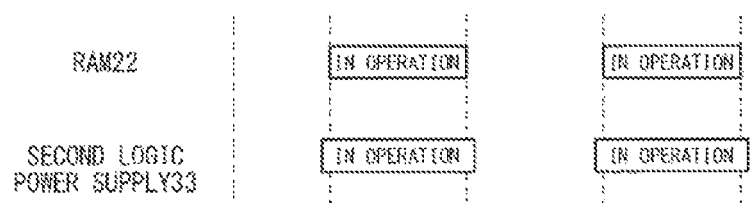
FIG. 7 is a timing chart illustrating an exemplary operation of the driver IC in the second embodiment.

More specifically, the RAM 22 is selected as the above-described "specific circuit" in the present embodiment. FIG. 7 is a timing chart illustrating an exemplary operation of the driver IC 12 in the present embodiment. In the present embodiment, the control signal $S_{CTRL\_PW2}$ is asserted by the logic circuit 27 to enable the second logic power supply circuit 33 a little time before the RAM 22, which receives the logic power supply voltage VDD from the power line 30, starts a write or read operation (in FIG. 7, denoted by the symbol "IN OPERATION"). The second logic power supply circuit 33 drives the power line 30 to maintain the power line 30 at the second preset voltage $V_2$, when the logic power supply voltage VDD generated on the power line 30 is about to become lower than the second preset voltage $V_2$. When the RAM 22 completes the write or read operation, the control signal $S_{CRTL\_PW2}$ is negated to disable the second logic power supply circuit 33 and the second logic power supply circuit 33 stops operating.

The above-described operation effectively avoids the degradation of the drive capacity of the logic power supply circuitry 29 with further reduced power consumption.

In the present embodiment, the logic circuit 27 may be configured to start a stop sequence when the logic circuit 27 detects a stop of the generation of the power supply voltages IOVCC and VSP; note that the stop sequence is an operation to control a circuitry that drives the gate lines 16 (that is, the GIP circuits 14L, 14R and the panel interface circuit 26 that controls these GIP circuits 14L, 14R) and a circuitry that drives the source lines 17 (that is, the source drive circuit 25) so that the charges remaining in the liquid crystal display panel 11 are discharged. When the liquid crystal display device 10 including the driver IC 12 of this embodiment is incorporated in a mobile terminal, a device that generates various power supply voltages in the mobile terminal (for example, a system PMIC (power management IC)) may stop the generation of the power supply voltages IOVCC and VSP, due to removal of a battery from the mobile terminal or the like. When the generation of the power supply voltages IOVCC and VSP is stopped, the liquid crystal display device 10 discontinues its operation. In this case, if charges remain in the liquid crystal display panel 11, this may cause an abnormal image display on the liquid crystal display panel 11 or a burn-in of the liquid crystal display panel 11. Accordingly, it is advantageous that, when the generation of the power supply voltages IOVCC and VSP is stopped, the stop sequence is started to discharge charges remaining in the liquid crystal display panel 11. Here, charges are held by power lines that feed the power supply voltages VSP and IOVCC to the external power supply terminals 41 and 43 of the driver IC 12 and by power supply capacitors connected to Phase power lines, just after the generation of the power supply voltages VSP and IOVCC is stopped. Accordingly, the use of these charges effectively allows operating the logic circuit 27 to perform the stop sequence. Since the power supply voltage VSP is a relatively-high voltage, a large amount of charges are held by the power line that feeds the power supply voltage VSP to the external power supply terminals 41 and by the power supply capacitor connected to this power line. The use of these charges effectively lengthens a time duration during which the logic circuit 27 can operate after the stop of the generation of the power supply voltages VSP and IOVCC, allowing the logic circuit 27 to successfully complete the stop sequence. In the following, a description is given of the operation of the driver IC 12 for providing the logic circuit 27 with an operable time sufficient for successfully completing the stop sequence by using the charges held by the power line that feeds the power supply voltage VSP to the external power supply terminals 41 and by the power supply capacitor connected to this power line.

The stop of the generation of the power supply voltages IOVCC and VSP causes a decrease in the power supply voltages IOVCC and VSP, and this causes a decrease in the logic power supply voltage VDD, when detecting that the logic power supply voltage VDD decreases below a third preset voltage $V_3$ that is lower than the second preset voltage $V_2$, the logic circuit 27 starts the stop sequence. In the stop sequence, the logic circuit 27 controls the circuits used to drive the gate lines 16 (that is, the GIP circuits 14L, 14R and the panel interface circuit 26, which controls these circuits) so as to select all the gate lines 16 of the liquid crystal display panel 11, and controls the source drive circuit 25 so as to connect all the source lines 17 to a ground terminal. This operation allows discharging the charges accumulated in the liquid crystal display panel 11.

In this operation, when detecting that the logic power supply voltage VDD is decreased below the third preset voltage $V_1$, the logic circuit 27 asserts the control signal $S_{CTRL\_PW2}$ to enable the second logic power supply circuit 33, independently of the write and read operations of the RAM 22. This allows the second logic power supply circuit 33 to start an operation for supplying the power line 30 with the charges accumulated on the power line that feeds the power supply voltage VSP to the external power supply terminal 41 and the power supply capacitor connected to this power line. The start of this operation by the second logic power supply circuit 33 effectively lengthens the time duration in which the logic power supply voltage VDD is kept in the range in which the logic circuit 27 can operate, allowing the logic circuit 27 to successfully complete the stop sequence.

Although various embodiments of the present disclosure are specifically described in the above, the present disclosure should not be construed as being limited to the above-described embodiments. A person skilled in the art would appreciate that the present disclosure may be implemented, with various modifications that do not depart from the scope of the present disclosure. Although the above-described embodiments recite that a power supply circuit according to the present disclosure is used as a logic power supply circuit of a driver IC that drives a liquid crystal display panel in a liquid crystal display device, the present disclosure is applicable to a display panel driver that drives a different type of display panel (for example, a plasma display panel) in a different type of display device.

It should be also noted that a power supply circuit according to the present disclosure is applicable to not only driver ICs in display devices, font also various semiconductor integrated circuits configured to externally receive a plurality of power supply voltages with different voltage levels.

What is claimed is:

1. A semiconductor integrated circuit, comprising:
   a power line;
   a power supply circuitry;
   a logic circuit; and
   a random access memory,
   wherein the power supply circuitry includes:
   a first power supply circuit configured to operate on a first power supply voltage and having an output connected with the power line; and
   a second power supply circuit configured to operate on a second power supply voltage higher than the first power supply voltage and having an output connected with the power line,
   wherein the first power supply circuit is configured to drive the power line to a first preset voltage,
   wherein the second power supply circuit is configured to drive the power line to a second preset voltage lower than the first preset voltage,
   wherein the second power supply circuit is configured not to decrease a third power supply voltage generated on the power line when the third power supply voltage is higher than the second preset voltage,
   wherein the logic circuit is configured to generate a control signal that enables and disables the second power supply circuit,
   wherein the random access memory is configured to operate on the third power supply voltage, and wherein the logic circuit is configured to set the control signal to enable the second power supply circuit before the random access memory starts a write or read operation, and is configured to set the control signal to disable the second power supply circuit after the random access memory completes the write or read operation.

2. The semiconductor circuit according to claim 1, further comprising:
a source drive circuit configured to drive source lines of a display panel, and
wherein the source drive circuit is configured to receive the second power supply voltage.

3. A semiconductor integrated circuit comprising: according to claim 1,
a power line; and
a power supply circuitry,
wherein the power supply circuitry includes:
a first power supply circuit configured to operate on a first power supply voltage and having an output connected with the power line; and
a second power supply circuit configured to operate on a second power supply voltage higher than the first power supply voltage and having an output connected with the power line,
wherein the first power supply circuit is configured to drive the power line to a first preset voltage,
wherein the second power supply circuit is configured to drive the power line to a second preset voltage lower than the first preset voltage,
wherein the second power supply circuit is configured not to decrease a third power supply voltage generated on the power line when the third power supply voltage is higher than the second preset voltage,
wherein the second power supply circuit comprises an operational amplifier having an output terminal connected with the power line, and
wherein the operational amplifier includes:
an output transistor configured to pull up the output terminal of the operational amplifier in response to a voltage on the output terminal of the operational amplifier; and
a load connected between a ground terminal and the output terminal of the operational amplifier and configured to operate independently of the voltage on the output terminal of the operational amplifier.

4. A semiconductor circuit, comprising:
a power line;
a power supply circuitry;
a source drive circuit configured to drive source lines of a display panel;
a logic circuit; and
a random access memory,
wherein the power supply circuitry includes:
a first power supply circuit configured to operate on a first power supply voltage and having an output connected with the power line; and
a second power supply circuit configured to operate on a second power supply voltage higher than the first power supply voltage and having an output connected with the power line,
wherein the first power supply circuit is configured to drive the power line to a first preset voltage,
wherein the second power supply circuit is configured to drive the power line to a second preset voltage lower than the first preset voltage,
wherein the second power supply circuit is configured not to decrease a third power supply voltage generated on the power line when the third power supply voltage is higher than the second preset voltage,
wherein the logic circuit is configured to generate a control signal that enables and disables the second power supply circuit,
wherein the random access memory is configured to operate on the third power supply voltage and storing therein image data externally fed to the random access memory,
wherein the source drive circuit configured to drive the source lines in response to the image data read from the random access memory,
wherein the logic circuit is configured to set the control signal to enable the second power supply circuit before the random access memory starts a write or read operation, and
wherein the logic circuit is configured to set the control signal to disable the second power supply circuit after the random access memory completes the write or read operation.

5. The semiconductor circuit according to claim 4, further comprising:
a panel interface circuit configured to control a gate-in-panel circuit integrated on the display panel to drive gate lines of the display panel,
wherein the logic circuit configured to control the source drive circuit and the panel interface circuit to discharge charges accumulated in the display panel when the third power supply voltage is decreased below a third preset voltage lower than the second preset voltage, and
wherein the logic circuit is configured to set the control signal to enable the second power supply circuit when the third power supply voltage on the power line is decreased below the third preset voltage.

6. A display device, comprising:
a display panel; and
a display panel driver configured to drive the display panel,
wherein the display panel driver includes:
a power line; and
a power supply circuitry,
wherein the power supply circuitry comprises:
a first power supply circuit configured to operate on a first power supply voltage and having an output connected with the power line; and
a second power supply circuit configured to operate on a second power supply voltage higher than the first power supply voltage and having an output connected with the power line,
wherein the first power supply circuit is configured to drive the power line to a first preset voltage,
wherein the second power supply circuit is configured to drive the power line to a second preset voltage lower than the first preset voltage,
wherein the second power supply circuit is configured not to decrease a third power supply voltage generated on the power line when the third power supply voltage is higher than the second preset voltage,
wherein the display panel driver further includes:
a logic circuit configured to generate a control signal that enables and disables the second power supply circuit; and
a specific circuit configured to operate on the third power supply voltage, wherein the logic circuit is configured to set the control signal to enable the second power supply circuit before the specific circuit starts a specific operation, wherein the logic circuit is configured to set the control signal to disable the second power supply circuit after the specific circuit completes the specific operation, wherein, when the third power supply voltage is decreased below a third preset voltage lower than the second preset voltage, the logic circuit is operable to control a circuitry that drives source lines of the display panel and a circuitry that drives gate lines of the display panel in a manner that results in charges accumulated in the display panel to be discharged, and wherein the logic circuit is configured to set the control signal to enable the second power supply circuit when the third power supply voltage on the power line is decreased below the third preset voltage.

7. A method for operating a display driver, comprising:

providing a first power supply voltage to a first power supply circuit having an output connected with a power line;

providing a second power supply voltage to a second power supply circuit having an output connected with the power line, the second power supply voltage being higher than the first power supply voltage;

driving, using the first power supply circuit, the power line to a first preset voltage;

driving, using the second power supply circuit, the power line to a second preset voltage, the second preset voltage being lower than the first preset voltage, wherein the second power supply circuit is configured not to decrease a third power supply voltage generated on the power line when the third power supply voltage is higher than the second preset voltage;

generating a control signal that enables and disables the second power supply circuit; and setting the control signal to enable the second power supply circuit before a random access memory starts a write or read operation, the random access memory operating on the third power supply voltage.

8. The method of claim 7, further comprising:

setting the control signal to disable the second power supply circuit after the random access memory completes the write or read operation.

9. A method for operating a display driver, comprising:

providing a first power supply voltage to a first power supply circuit having an output connected with a power line;

providing a second power supply voltage to a second power supply circuit having an output connected with the power line, the second power supply voltage being higher than the first power supply voltage;

driving, using the first power supply circuit, the power line to a first preset voltage;

driving, using the second power supply circuit, the power line to a second preset voltage, the second preset voltage being lower than the first preset voltage, wherein the second power supply circuit comprises an operational amplifier having an output terminal connected with the power line and is configured not to decrease a third power supply voltage generated on the power line when the third power supply voltage is higher than the second preset voltage; and pulling up the output terminal of the operational amplifier by using an output transistor in response to a voltage on the output terminal of the operational amplifier.

* * * * *